(12) United States Patent
Strijker (10) Patent No.: US 11,108,402 B1
(45) Date of Patent: Aug. 31, 2021

(54) DELAY COMPENSATED SINGLE SLOPE ANALOG-TO-DIGITAL CONVERTER

(71) Applicant: NXP B.V., Eindhoven (NL)

(72) Inventor: Joan Wichard Strijker, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/013,129

(22) Filed: Sep. 4, 2020

(51) Int. Cl.
*H03M 1/06* (2006.01)
*H03M 1/10* (2006.01)

(52) U.S. Cl.
CPC ....... *H03M 1/0697* (2013.01); *H03M 1/1033* (2013.01)

(58) Field of Classification Search
CPC .......................... H03M 1/0697; H03M 1/1033
See application file for complete search history.

(56) References Cited

U.S. PATENT DOCUMENTS

| | | | |
|---|---|---|---|
| 5,963,044 A | 10/1999 | Schaefer | |
| 6,346,907 B1 | 2/2002 | Darcy et al. | |
| 7,924,207 B2* | 4/2011 | Snoeij | H03M 1/144 341/169 |
| 9,667,899 B2* | 5/2017 | Gou | H03M 1/14 |
| 9,912,883 B1* | 3/2018 | Lee | H04N 5/378 |
| 2007/0013799 A1* | 1/2007 | Hirota | H04N 5/217 348/311 |
| 2009/0045985 A1* | 2/2009 | Houng | H03M 1/26 341/5 |
| 2011/0169990 A1* | 7/2011 | Higuchi | H03K 4/48 348/302 |
| 2011/0200070 A1* | 8/2011 | Makinwa | G06K 19/0723 374/170 |
| 2012/0169909 A1* | 7/2012 | Rysinski | H04N 17/002 348/302 |
| 2014/0375858 A1* | 12/2014 | Lee | H03K 4/026 348/308 |

(Continued)

OTHER PUBLICATIONS

"EE247—Lecture 19—Nyquist Rate ADCs"; 35 pages (2008).
(Continued)

*Primary Examiner* — Lam T Mai (57) ABSTRACT

Various embodiments relate to a single slope analog to digital converter (ADC), including: a voltage slope generator; a reference voltage generator configured to generate a first reference voltage, a second reference voltage, and a third reference voltage, where the first reference voltage equals the sum of the second reference voltage and the third reference voltage; a first comparator configured to compare a voltage to a voltage output from the voltage slope generator; a first register configured to store a first count based upon the first reference voltage being input into the first comparator; a second register configured to store a second count based upon the second reference voltage being input into the first comparator; a third register configured to store a third count based upon the third reference voltage being input into the first comparator; a fourth register configured to store a fourth count based upon a first input voltage being input into the first comparator, wherein the first input voltage is the voltage to be converted to a digital value by the ADC; and an output circuit configured to calculate a digital value for the first input voltage based upon the first, second, third, and fourth counts.

21 Claims, 7 Drawing Sheets

(56) References Cited

U.S. PATENT DOCUMENTS

| | | | |
|---|---|---|---|
| 2015/0116003 A1* | 4/2015 | Yoo | H03F 3/45475 |
| | | | 327/56 |
| 2015/0146066 A1* | 5/2015 | Gou | H03M 1/18 |
| | | | 348/308 |
| 2017/0064237 A1* | 3/2017 | Aibara | H04N 5/378 |
| 2019/0260384 A1* | 8/2019 | Liobe | H04N 5/378 |

OTHER PUBLICATIONS

Osaki, Y., et al. "A Low-Power Single-Slope Analog-to-Digital Converter with Digital PVT Calibration", IEEE International Conference on Electronics, Circuits and Systems, Seville, Spain; 4 pages (Dec. 2012).

* cited by examiner

DELAY COMPENSATED SINGLE SLOPE ANALOG-TO-DIGITAL CONVERTER

TECHNICAL FIELD

Various exemplary embodiments disclosed herein relate generally to a delay compensated single slope analog-to-digital converter (ADC).

BACKGROUND

Single slope analog-to-digital converters (ADC) are widely used in a variety of different electronic systems because of their simplicity. The accuracy of the conversion may be improved by compensation and calibration. Such compensation may use multiple accurate reference voltages with the single slope ADC.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a single slope analog to digital converter (ADC), including: a voltage slope generator; a reference voltage generator configured to generate a first reference voltage, a second reference voltage, and a third reference voltage, where the first reference voltage equals the sum of the second reference voltage and the third reference voltage; a first comparator configured to compare a voltage to a voltage output from the voltage slope generator; a first register configured to store a first count based upon the first reference voltage being input into the first comparator; a second register configured to store a second count based upon the second reference voltage being input into the first comparator; a third register configured to store a third count based upon the third reference voltage being input into the first comparator; a fourth register configured to store a fourth count based upon a first input voltage being input into the first comparator, wherein the first input voltage is the voltage to be converted to a digital value by the ADC; and an output circuit configured to calculate a digital value for the first input voltage based upon the first, second, third, and fourth counts.

Various embodiments are described, wherein the reference voltage generator includes a voltage source generating the first voltage reference, a first resistor, and a second resistor, wherein the second voltage reference is based upon the first resistor, and the third voltage reference is based upon the second resistor.

Various embodiments are described, wherein the second voltage reference Vref2 is:

$$Vref2 = Vref1*R1/(R1+R2); \text{ and}$$

the third reference voltage Vref3 is:

$$Vref3 = Vref1*R2/(R1+R2),$$

where Vref1 is the first voltage reference, R1 is the resistance of the first resistor, and R2 is the resistance of the second resistor.

Various embodiments are described, wherein the reference voltage generator further includes three switches that are used to produce the first, second, and third reference voltages.

Various embodiments are described, further including a switch connected a first input of the first comparator, wherein the switch selects between the first input voltage and an output of the reference voltage generator.

Various embodiments are described, wherein the digital value for the first input voltage is calculated as:

$$V_X = Vref \frac{Reg1 + Reg2 - Reg3 - Reg4}{2 \cdot Reg1 - Reg3 - Reg4},$$

where Vref is the first voltage reference, Reg1 is the first count stored in the first register, Reg2 is the second count stored in the second register, Reg3 is the third count stored in the third register, and Reg4 is the fourth count stored in the fourth register.

Various embodiments are described, wherein the values of first, second, and third registers are sequentially determined during a first voltage slope of the voltage slope generator, and the value of the fourth register is determined during a second voltage slope of the voltage slope generator.

Various embodiments are described, further including digital to analog comparator (DAC), wherein the DAC includes: a buffer circuit connected to the output of the voltage slope generator; a sample and hold switch connected to the to an output of the buffer circuit, wherein the output of the sample and hold circuit is the analog voltage output of the DAC; a DAC capacitor connected between the output of the sample and hold switch and ground; a digital comparator that compares a digital input value to a clock value; and a pulse generator with an input connected to an output of the digital comparator and an output configured to control the sample and hold switch, wherein the pulse generator produces an output pulse when the digital comparator determines that the clock value is equal to the digital input value.

Various embodiments are described, wherein the DAC further includes an add_subtract circuit configured to: receive inputs of a digital value, the fourth count Reg4 from the fourth register, and a calculated value of the delay td of the first comparator; and produce an adjusted digital value that is input into the digital comparator as the input value.

Various embodiments are described, wherein the ADC is configured to produce a first output value Vadc1 on a first slope that is fed into the DAC and to produce a second output value Vadc2 using the Reg4 and td values from the ADC output based upon the first output value Vadc1.

Various embodiments are described, further including: a second comparator configured to compare a second input voltage to the voltage from the voltage slope generator; and a fifth register configured to store a fifth count based upon the second input voltage being input into the second comparator, wherein output circuit is configured to calculate a digital value for the first input voltage based upon the first, second, third, and fifth counts.

Further various embodiments relate to a method for converting analog voltages to a digital value using a single slope analog to digital converter (ADC), including: generating voltage slope; generating a first reference voltage, a second reference voltage, and a third reference voltage, where the first reference voltage equals the sum of the second reference voltage and the third reference voltage; comparing the first reference voltage to a voltage output from the generated voltage slope and storing a first count based upon the first reference voltage; comparing the second reference voltage to the voltage output from the generated voltage slope and storing a second count based upon the second reference voltage; comparing the third reference voltage to the voltage output from the generated voltage slope and storing a third count based upon the third reference voltage;

comparing a first input voltage to the voltage output from the generated voltage slope and storing a fourth count based upon the first input voltage; and calculating a digital value for the first input voltage based upon the first, second, third, and fourth counts.

Various embodiments are described, wherein the second voltage reference is based upon a first resistor and the first reference voltage and the third voltage reference is based upon a second resistor and the first reference voltage.

Various embodiments are described, wherein the second voltage reference Vref2 is:

$$Vref2 = Vref1 * R1/(R1+R2); \text{ and}$$

the third reference voltage Vref3 is:

$$Vref3 = Vref1 * R2/(R1+R2),$$

where Vref1 is the first voltage reference, R1 is the resistance of the first resistor, and R2 is the resistance of the second resistor.

Various embodiments are described, wherein generating the first reference voltage, the second reference voltage, and the third reference voltage includes controlling three switches that are used to produce the first, second, and third reference voltages.

Various embodiments are described, wherein the digital value for the first input voltage is calculated as:

$$V_X = Vref \frac{Reg1 + Reg2 - Reg3 - Reg4}{2 \cdot Reg1 - Reg3 - Reg4},$$

where Vref is the first voltage reference, Reg1 is the first stored count, Reg2 is the second stored count, Reg3 is the third stored count, and Reg4 is the fourth stored count.

Various embodiments are described, wherein the values of first, second, and third counts are sequentially stored during a first generated voltage slope, and the value of the fourth count is stored during a second generated voltage slope.

Various embodiments are described, further including converting a digital value to an analog voltage further including: buffering the generated voltage slope; comparing a digital input value to a clock value; and sampling and holding the buffered generated slope circuit when the clock value is equal to the digital input value.

Various embodiments are described, further including: receiving inputs of a digital value, the fourth count Reg4 from the fourth register, and a calculated value of the delay td of the first comparator; and producing an adjusted digital value that is compared to the clock value.

Various embodiments are described, further including producing a first output value Vadc1 on a first generated slope and producing a second output value Vadc2 using the Reg4 and td values from the associated with the first output value Vadc1.

Various embodiments are described, further including: comparing a second input voltage to the voltage output from the generated voltage slope and storing a fifth count based upon the second input voltage; and calculating a digital value for the second input voltage based upon the first, second, third, and fifth counts.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Figure 1:
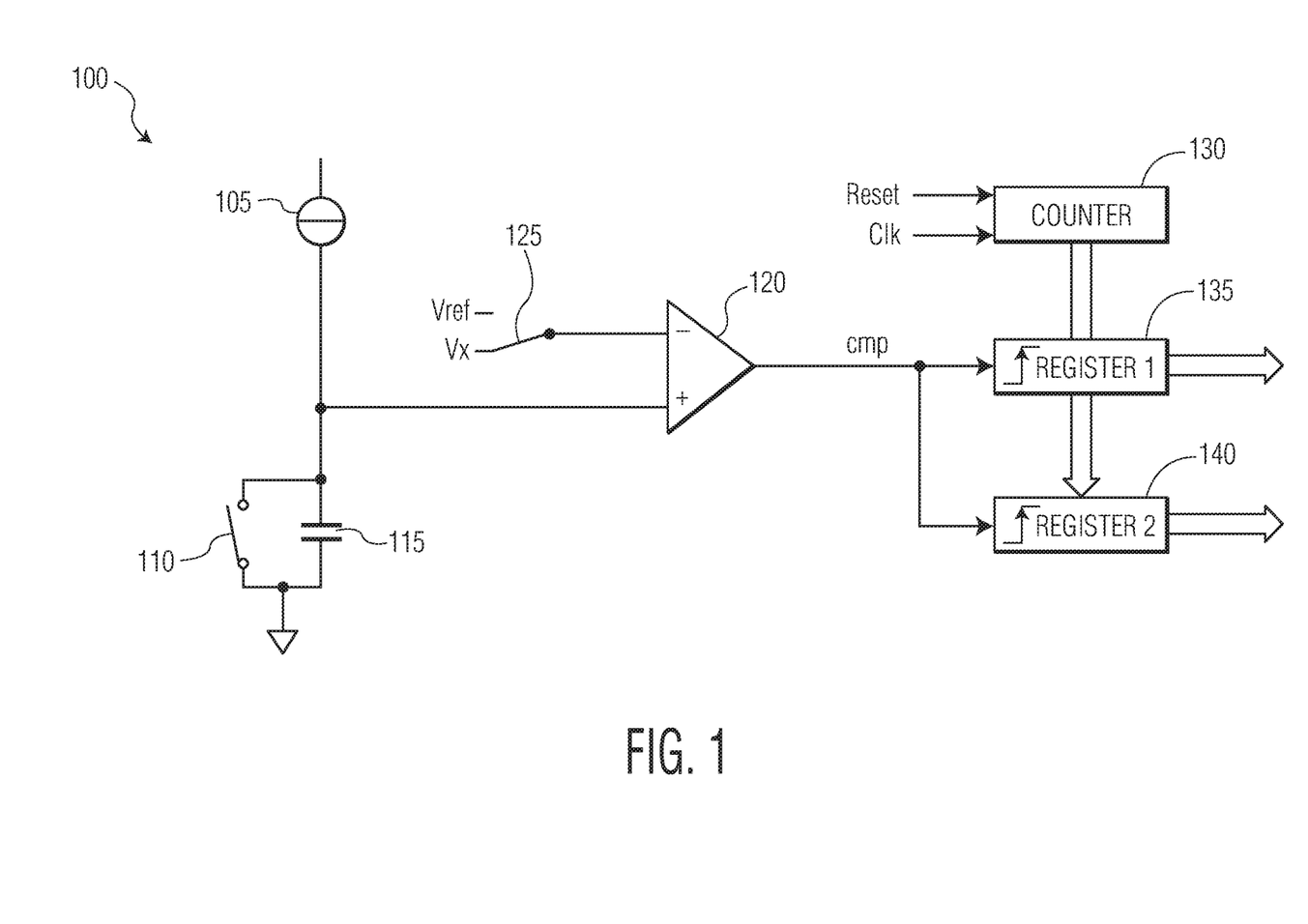
FIG. 1 illustrates a basic single slope ADC.

ADCs may be implemented using a voltage slope. FIG. 1 illustrates a basic single slope ADC 100. A voltage slope is created with current source 105 producing a current Islope and capacitor Cslope 115. The dv/dt of the voltage slope is Islope/Cslope. The voltage slope is started by opening slope switch 110. As soon as the voltage slope starts, a counter 130, producing a count Count, is also started by removing a Reset signal input into the counter 130. The counter also receives a clock signal Clk that cause the counter to increment with each clock cycle.

For calibration, a reference voltage Vref (as selected by a switch 125) and the slope voltage are connected to an analog comparator 120. When the slope voltage reaches the reference voltage Vref, the comparator 120 trips causing the current counter value to be stored in first register (Reg1) 135. This count is indicative of the analog voltage value Vref and provides a calibration basis.

To convert an analog voltage, Vx, to a digital value, the analog voltage Vx is connected to the analog comparator 120. Switch 125 is used to connect either the reference voltage Vref or the analog voltage Vx to the comparator 120. As soon as the voltage slope starts, a counter 130, producing a count Count1, is also started by removing a Reset signal input into the counter 130. Again, when the voltage slope reaches the analog voltage Vx, the comparator 120 trips and the counter value is stored in a second register (Reg2) 140 indicative of the analog voltage value Vx.

If the offset and the delay of the comparator is neglected, Reg 1 135 and Reg2 140 will store the values:

$$Reg1 = Fclk \frac{Vref}{dvdt}; \text{ and} \qquad (1)$$

$$Reg2 = Fclk \frac{V_X}{dvdt}. \qquad (2)$$

Fclk is the clock frequency used for the counter and dvdt is the voltage slope Islope/Cslope.

The value of Vx can then be calculated as:

$$V_X = Reg2 \frac{Vref}{Reg1} AD. \qquad (3)$$

By using the reference voltage, the value of the clock frequency and the slope value is not needed for the analog to digital conversion.

To compensate for the offset and delay in the comparator 130, two accurate reference voltages may be used. The digital value for an input voltage Vx may then be found using simple arithmetic operations.

Figure 2:
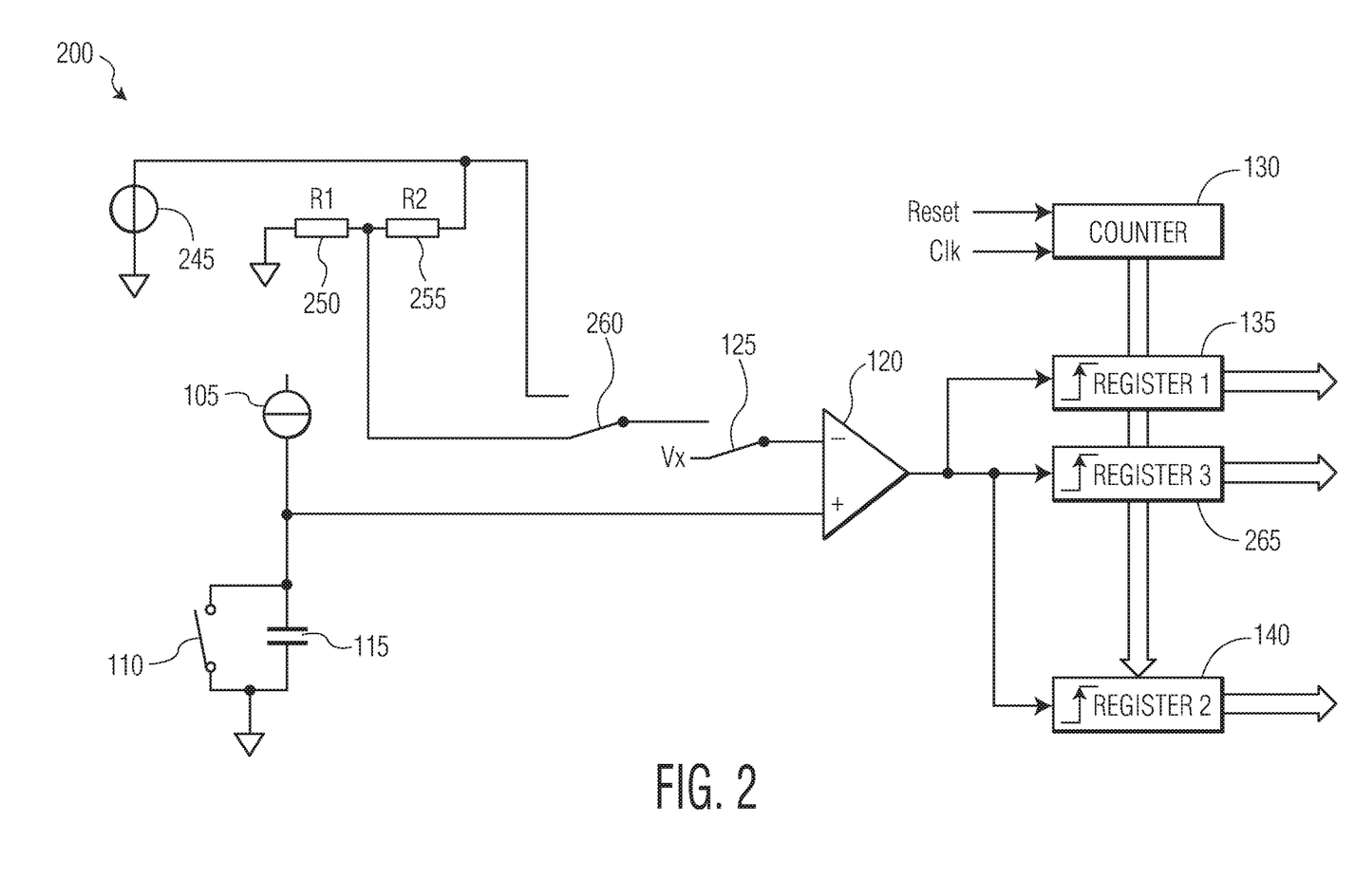
FIG. 2 illustrates a current art single slope ADC using two reference voltages.

FIG. 2 illustrates a current art single slope ADC using two reference voltages. FIG. 2 adds various elements to the ADC of FIG. 1. The ADC 200 adds a voltage reference Vref 245, resistors R1 250 and R2 255, switch 260, and register (Reg3) 265. The voltage reference Vref 245 is connected to R2 255 and the switch 260. The series resistors R1 250 and R2 255 form a voltage divider producing a voltage of (R1/(R1+R2) *Vref which is also connected to the switch 260. The switch 260 now allows for two different reference voltages to be used, i.e., Vref and (R1/(R1+R2)*Vref. The registers Reg1 135 and Reg2 140 store the same values as before. The new register Reg3 stores a count related to (R1/(R1+R2)*Vref. More specifically the registers will store:

$$Reg1 = Fclk\left(\frac{Vref}{dvdt} + td\right); \qquad (20)$$

$$Reg3 = Fclk\left(\frac{R1}{R1+R2}\frac{Vref}{dvdt} + td\right); \text{ and} \qquad (21)$$

$$Reg2 = Fclk\left(\frac{V_X}{dvdt} + td\right)\frac{V_X}{dvdt}. \qquad (22)$$

From (20), (21) and (22) Vx may be derived:

$$V_X = \frac{Vref \cdot R1}{R1+R2} + \frac{Reg2 - Reg3}{Reg1 - Reg3}\left(Vref - \frac{Vref \cdot R1}{R1+R2}\right). \qquad (23)$$

The delay td, the clock frequency Fclk and the slope dvdt are not in equation (23), but R1 and R2 need to have an accurate ratio: i.e., R1/(R1+R2) needs to be accurate. Although resistor matching may be good in integrated circuits, matching better than 0.5% can be challenging especially when a small chip area is required.

Although zero volts and Vref may be used as references, this is not a practical. The slope would need to start from a negative voltage. For single supply voltage applications, this does not offer a practical solution.

Figure 3:
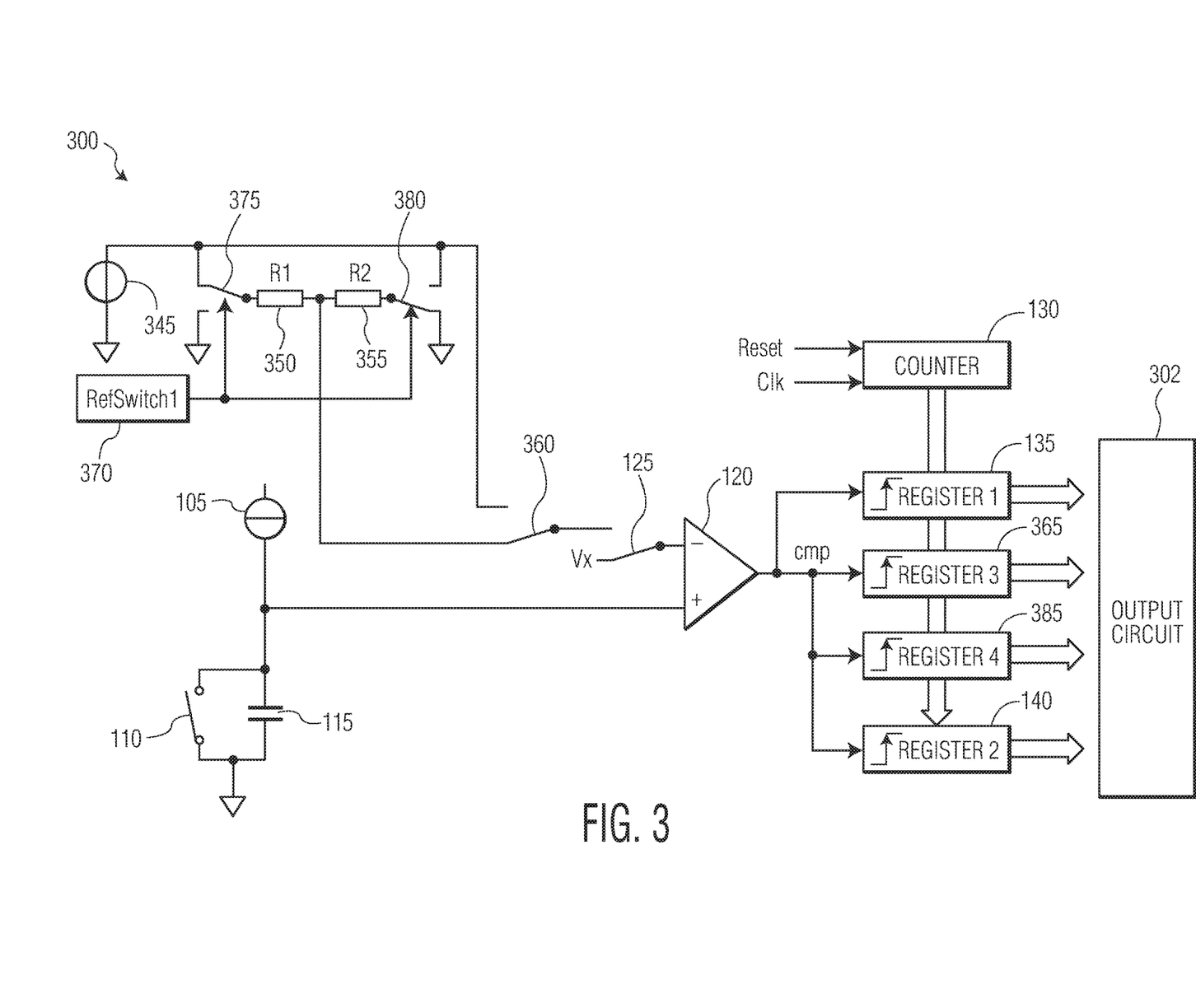
FIG. 3 illustrates an embodiment of a single slope ADC that compensates for the comparator delay.

FIG. 3 illustrates an embodiment of a single slope ADC that compensates for the comparator delay. The ADC 300 uses three reference voltages to help compensate for the compensator delay. Compared to the ADC 100 of FIG. 1, the ADC 300 adds a voltage reference Vref 345, resistors R1 350 and R2 355, switchers 375, 380, and 360, and registers 365 and 385. The voltage reference Vref 345 is connected to switches 375, 380, and 360. The resistor R1 350 is connected between switch 375 and switch 360. The resistor R2 355 is connected between switch 380 and switch 360. The configuration of the Vref 345, switches 375, 380, and 360, and resistors R1 350 and R2 355 allow three different reference voltages to be applied to the comparator 120, based upon the configuration of the switches 375, 380, and 360. The three reference voltages produced are:

$$Vref1 = Vref; \qquad (4)$$

$$Vref2 = \frac{R1}{R1+R2}Vref; \qquad (5)$$

$$Vref3 = \frac{R2}{R1+R2}Vref. \qquad (6)$$

Reference voltage Vref2 and Vref3 are created with two resistors R1 and R2. The resistors are connected to each other on one side. Vref2 is created by connecting the other side of R1 to Vref and the other side of R2 to ground. Vref3 is created by connecting the other side of R2 to Vref and the other side of R1 to ground.

By switching switches 375, 380, 360, and 125 the analog comparator 120 may be connected to the three different reference voltages or the input voltage Vx to be converted. When the comparator 120 trips, the corresponding register stores the counter value. Registers Reg1 135, Reg3 365, and Reg4 385 store counts related to the three different reference voltages. Register Reg 2 140 stores the count related to the input voltage Vx to be converted. Specifically, the registers will store the values:

$$Reg1 = Fclk\left(\frac{Vref}{dvdt} + td\right); \qquad (7)$$

$$Reg2 = Fclk\left(\frac{V_X}{dvdt} + td\right); \qquad (8)$$

$$Reg3 = Fclk\left(\frac{R1}{R1+R2}\frac{Vref}{dvdt} + td\right); \qquad (9)$$

$$Reg4 = Fclk\left(\frac{R2}{R1+R2}\frac{Vref}{dvdt} + td\right). \qquad (10)$$

Again td is the delay of the analog comparator 120.

This delay td may be calculated by adding Reg3 and Reg4 and subtracting Reg1:

$$Reg3 + Reg4 - Reg1 = Fclk\left(\frac{R1}{R1+R2}\frac{Vref}{dvdt} + td\right) + \qquad (11)$$
$$Fclk\left(\frac{R2}{R1+R2}\frac{Vref}{dvdt} + td\right) - Fclk\left(\frac{Vref}{dvdt} + td\right)$$

This calculation simplifies to:

$$Reg3 + Reg4 - Reg1 = Fclk \cdot td \qquad (12)$$

So by dividing Reg3+Reg4−Reg1 by Fclk, the delay td is found.

From (7) it may be derived:

$$\frac{dvdt}{Fclk} = \frac{Vref}{Reg1 - Fclk \cdot td} \quad (13)$$

From (8) Vx may be derived:

$$V_X = (Reg2 - Fclk \cdot td)\frac{dvdt}{Fclk} \quad (14)$$

From (12), (13) and (14) Vx may be further derived as:

$$V_X = (Reg2 - (Reg3 + Reg4 - Reg1))\frac{Vref}{Reg1 - (Reg3 + Reg4 - Reg1)} \quad (15)$$

This simplifies to:

$$V_X = Vref\frac{Reg1 + Reg2 - Reg3 - Reg4}{2 \cdot Reg1 - Reg3 - Reg4} \quad (16)$$

From (16) it can be seen that Vx is not dependent on the value of R1, R2, the comparator delay td, or the clock frequency Fclk. Only a single accurate voltage Vref is needed for the analog to digital conversion. This holds for all values of R1 and R2 because the following is always true:

$$\frac{R1}{R1 + R2} + \frac{R2}{R1 + R2} = 1 \quad (17)$$

An output circuit 302 may then be used to implement the calculation of (16) to produce the digital value for Vx.

The delay of the analog comparator is typically the same for every level crossing because the voltage slope is the same for every level. In an integrated circuit typically, the delay is dependent on the bias current setting, the temperature, and the parasitics of the chip layout. By regularly performing a calibration cycle, changes in the delay due to for example temperature variations of the chip, are accounted for.

Figure 4:
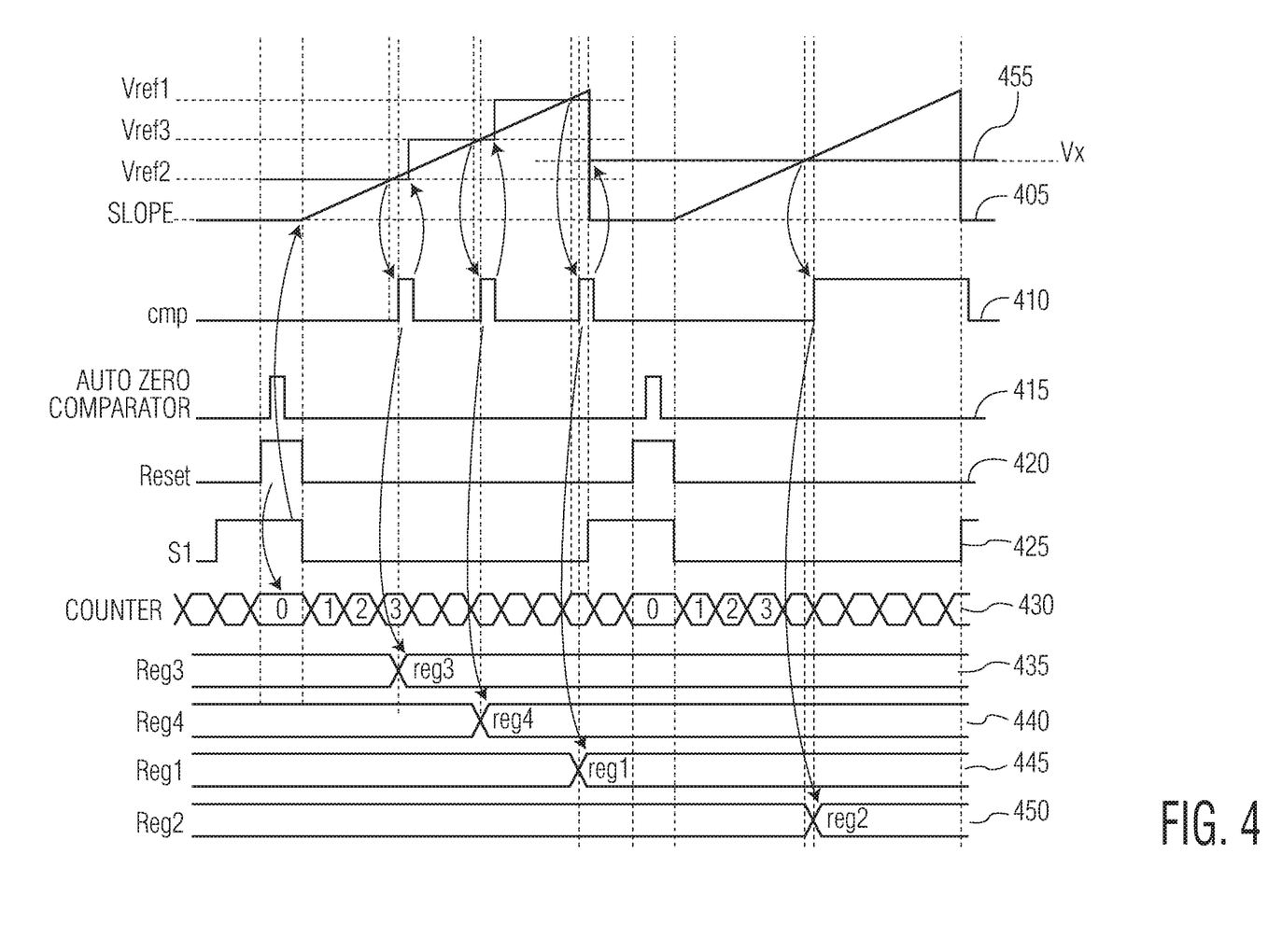
FIG. 4 illustrates the use of two slope cycles to calibrate the ADC and to convert a voltage Vx.

FIG. 4 illustrates the use of two slope cycles to calibrate the ADC and to convert a voltage Vx. FIG. 4 includes a slope plot (slope) 405, comparator output (cmp) plot 410, auto zero comparator plot 415, reset signal plot 420, control signal for switch (S1) 110, counter plot (counter) 425, and plots 435, 440, 445, 450 of the control signal for the registers 365, 385, 135, 140 respectively. For a practical implementation, the resistance value of R2 may be chosen twice the value of R1. Then Vref2=⅓*Vref and Vref3=⅔*Vref, but other values may be chosen as well. The values for Reg1, Reg3 and Reg4 can then be found in a single slope conversion as shown in FIG. 4.

First the comparator 120 input is set to Vref2=⅓*Vref using switches 375 360, and 125. As soon as the slope voltage reaches this value and Reg3 is filled with the counter value, the comparator input is switched to Vref3=⅔*Vref using switches 380, 360, and 125. The slope voltage will then continue to rise to this value and Reg4 is filled with the counter value. After this the comparator input is switched to Vref1=Vref using switch 360. As soon as the slope voltage reaches Vref, Reg1 is filled with the counter value again.

The exact value or ratio of R1 and R2 is not relevant except in the timing of changing the configuration of the switches 275, 380, 360, and 125. Also, if the value of R1 or R2 changes due to the processing in an integrated circuit or due to temperature variations, no error is made (assuming the R1 and R2 value do not change significantly in one calibration cycle which would not be a typical occurrence).

The offset of the analog comparator is not considered in the above calculations. An offset will result in an error. However, in integrated circuits auto-zeroing it is a known technique and for a single slope ADC the auto-zero can be executed just before the slope starts as shown in plot 415.

In FIG. 4 two slope cycles are drawn. In the first slope cycle the calibration is done and the delay is derived from the Reg1, Reg3 and Reg4 values. In the second slope cycle the analog voltage Vx is converted. Vx may be calculated with equation (16). Before every cycle, an auto-zero signal 415 is applied to the analog comparator to compensate for offsets. The calibration shown in the first slope may be performed before every Vx slope or periodically every N cycles.

Figure 5:
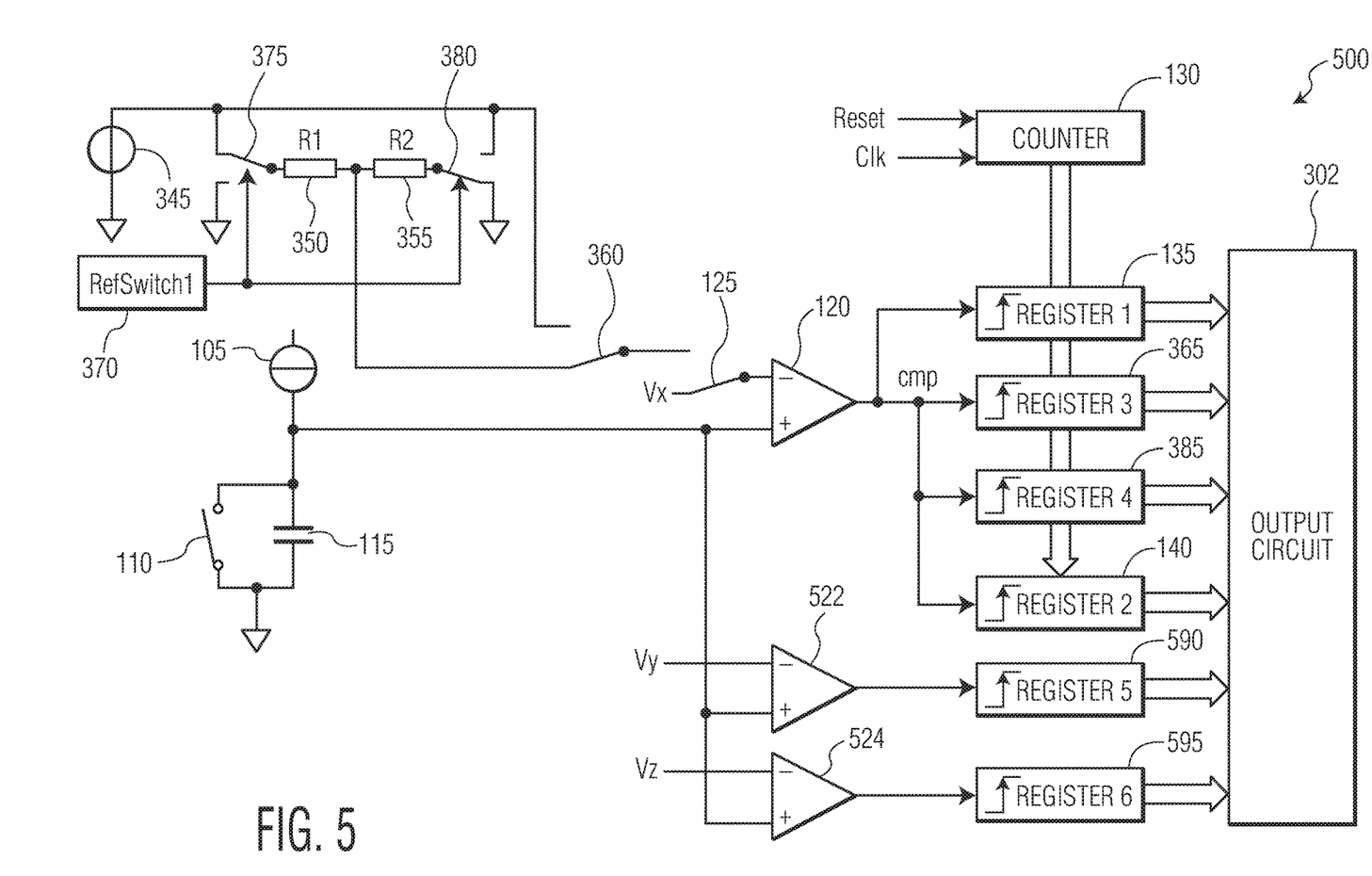
FIG. 5 illustrates an ADC that can convert three input voltages in parallel.

In integrated circuits the delay of analog comparators typically match well if the chip layout is the same. This property can be used to do several analog to digital conversions in parallel. FIG. 5 illustrates an ADC that can convert three input voltages in parallel. In FIG. 5 two additional analog comparators 522 and 524 are illustrated with input signals Vy and Vz. While convert three input signals is show, more or fewer signals may also be converted in parallel. If the delay of these comparators is the same as for the reference comparator 135, the analog to digital conversion of Vy and Vz may be done without additional calibration of these two comparators. These comparators will also need auto-zeroing for offset compensation, but as the layout of all comparators needs to be the same for delay matching, this auto-zeroing circuit will also be present. The outputs of the comparators 522 and 524 trigger registers 590 and 595 respectively which will include the counts used to calculate the digital values of input voltages Vy and Vz.

Note that the magnitude of the delay of the comparators is not critical. Although a smaller delay typically has better absolute delay matching, a longer delay does not influence the accuracy. The comparators may therefore be biased with low currents which is beneficial for low power applications that require multiple simultaneous analog to digital conversions. All analog to digital conversions may be done in one slope cycle.

As the delay is not critical, the comparator output can be connected to a synchronizer to prevent metastability in the digital circuit. The synchronization delay (of one or more clocks), is then included in the value td (i.e., td equals the sum of the comparator delay and the synchronization delay).

Figure 6:
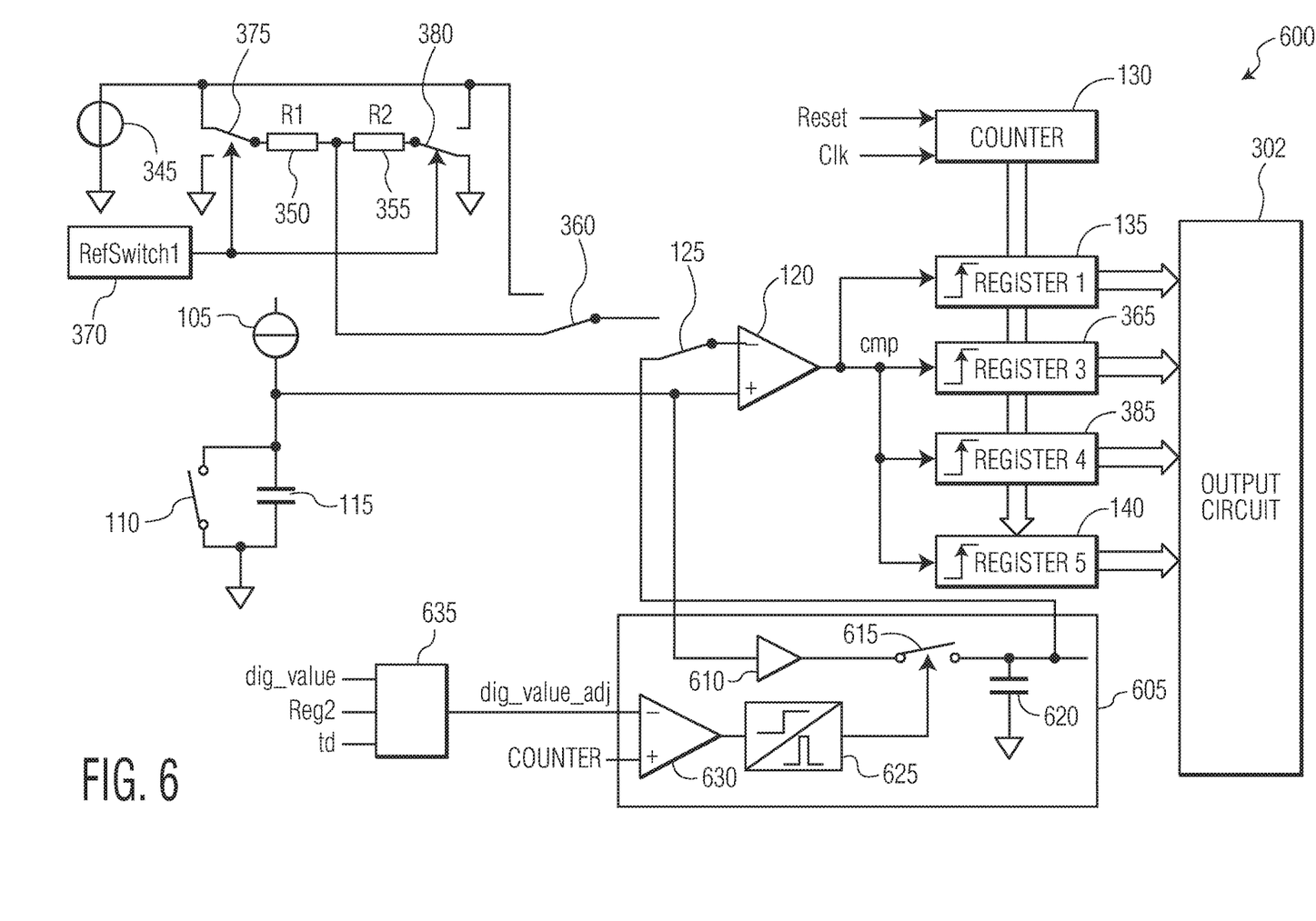
FIG. 6 illustrates an embodiment of the ADC/DAC.
Figure 7:
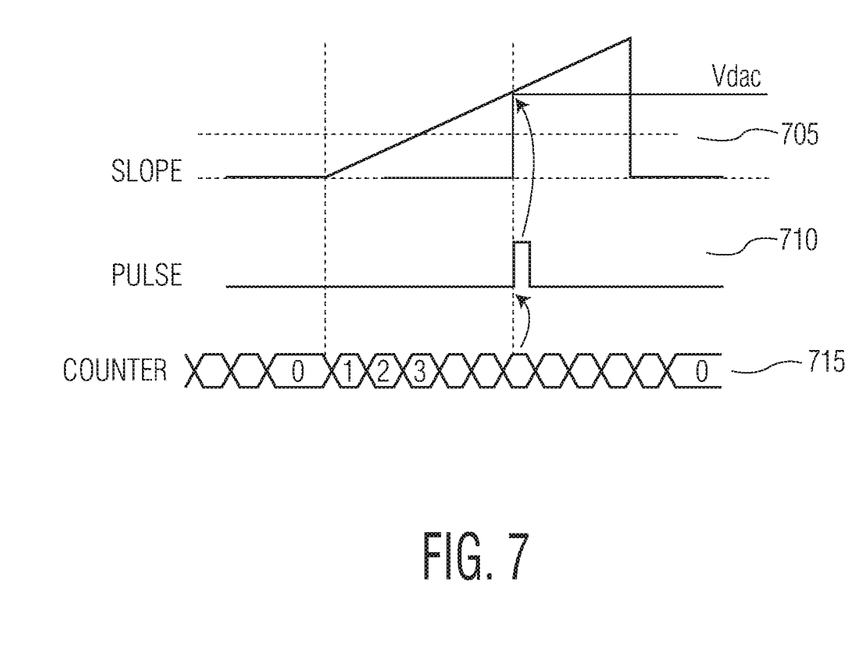
FIG. 7 illustrates the timing diagram for the DAC.

In addition to the ADC functionality, a digital to analog conversion (DAC) may also be done using a single slope resulting in a ADC/DAC. FIG. 6 illustrates an embodiment of the ADC/DAC 600. The ADC portion is the same as the ADC shown in FIG. 3. The ADC/DAC 600 adds a DAC 605. The DAC 605 includes a buffer 610, a sample and hold switch 615, a capacitor Cdac 620, a pulse circuit 625, and a digital comparator 630. The sample and hold switch 615 is closed momentarily when the counter reaches the digital value to be converted. The digital comparator 630 and pulse circuit 625 create a pulse to drive the sample and hold switch 615. FIG. 7 illustrates the timing diagram for the DAC 605.

The plot 705 shows the slope signal. When the counter 715 reaches the desired digital value a pulse is generated as shown in plot 710. At that point, the sample and hold switch 615 closes briefly to sample the current analog voltage value which is then the converted analog voltage corresponding the input digital value. The buffer 610 is used to prevent the sampling of the slope voltage from affecting the slope voltage.

In order to compensate for offsets of the voltage buffer 610 and the error in the sample and hold circuit (sample and hold switch 615 and capacitor Cdac 620), the DAC 605 output voltage, Vdac, may be fed back into the ADC as illustrated. As the ADC compensates for its own errors, the measured value Reg2=Fclk*(Vdac/dvdt+td) may be used to compensate for the DAC error. This may be done by producing an adjusted digital value, dig_value_adj, using an add_subtract circuit 635. The adjusted digital value dig_value_adj is based upon the input digital value dig_value, the value Reg2 in the register 140, and the td value calculated by the ADC. In the next slope cycle the Vdac value is updated with the error compensated value. This next Vdac cycle will produce an accurate analog voltage. Further digital to analog cycles may use the calculated error to compensate the next conversions. For every further digital to analog conversion, an analog to digital conversion may be done also in the next cycle to continuously update the error value or it may be done every N digital to analog conversion cycles.

The ADC and ADC/DAC embodiments described above have the benefit of using a single accurate reference voltage which simplifies the ADC circuitry. Current existing ADCs use multiple accurate reference voltages. Ratio mismatch of these voltages will lead to errors. In the ADC embodiments described herein a single (e.g., bandgap derived) voltage may be used and two further reference voltages derived. The other two reference voltages do not need to be accurate as the sum of the two voltages always equals the first mentioned reference voltage.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in anyway limit the invention, which is defined only by the claims.

What is claimed is:

1. A single slope analog to digital converter (ADC), comprising:
    a voltage slope generator;
    a reference voltage generator configured to generate a first reference voltage, a second reference voltage, and a third reference voltage, where the first reference voltage equals a sum of the second reference voltage and the third reference voltage;
    a first comparator configured to compare a voltage to a voltage output from the voltage slope generator;
    a first register configured to store a first count based upon the first reference voltage being input into the first comparator;
    a second register configured to store a second count based upon the second reference voltage being input into the first comparator;
    a third register configured to store a third count based upon the third reference voltage being input into the first comparator;
    a fourth register configured to store a fourth count based upon a first input voltage being input into the first comparator, wherein the first input voltage is the voltage to be converted to a digital value by the single slope ADC; and
    an output circuit configured to calculate a digital value for the first input voltage based upon the first, second, third, and fourth counts.

2. The ADC of claim 1, wherein the reference voltage generator includes a voltage source generating the first voltage reference, a first resistor, and a second resistor, wherein the second voltage reference is based upon the first resistor, and the third voltage reference is based upon the second resistor.

3. The ADC of claim 2, wherein the second voltage reference Vref2 is:

$$Vref2 = Vref1 * R1/(R1+R2);\text{ and}$$

the third reference voltage Vref3 is:

$$Vref3 = Vref1 * R2/(R1+R2),$$

where Vref1 is the first voltage reference, R1 is the resistance of the first resistor, and R2 is the resistance of the second resistor.

4. The ADC of claim 2, wherein the reference voltage generator further includes three switches that are used to produce the first, second, and third reference voltages.

5. The ADC of claim 1, further comprising a switch connected a first input of the first comparator, wherein the switch selects between the first input voltage and an output of the reference voltage generator.

6. The ADC of claim 1, wherein the digital value for the first input voltage is calculated as:

$$V_X = Vref \frac{Reg1 + Reg2 - Reg3 - Reg4}{2 \cdot Reg1 - Reg3 - Reg4},$$

where Vref is the first voltage reference, Reg1 is the first count stored in the first register, Reg2 is the second count stored in the second register, Reg3 is the third count stored in the third register, and Reg4 is the fourth count stored in the fourth register.

7. The ADC of claim 1, wherein the values of first, second, and third registers are sequentially determined during a first voltage slope of the voltage slope generator, and the value of the fourth register is determined during a second voltage slope of the voltage slope generator.

8. The ADC of claim 1, further comprising digital to analog comparator (DAC), wherein the DAC includes:
    a buffer circuit connected to the output of the voltage slope generator;
    a sample and hold switch connected to the to an output of the buffer circuit, wherein the output of the sample and hold circuit is the analog voltage output of the DAC;
    a DAC capacitor connected between the output of the sample and hold switch and ground;
    a digital comparator that compares a digital input value to a clock value; and
    a pulse generator with an input connected to an output of the digital comparator and an output configured to control the sample and hold switch, wherein the pulse generator produces an output pulse when the digital comparator determines that the clock value is equal to the digital input value.

9. The ADC of claim 8, wherein the DAC further includes an add_subtract circuit configured to:
receive inputs of a digital value, the fourth count Reg4 from the fourth register, and a calculated value of the delay td of the first comparator; and
produce an adjusted digital value that is input into the digital comparator as the input value.

10. The ADC of claim 9, wherein the ADC is configured to produce a first output value Vadc1 on a first slope that is fed into the DAC and to produce a second output value Vadc2 using the Reg4 and td values from the ADC output based upon the first output value Vadc1.

11. The ADC of claim 1, further comprising:
a second comparator configured to compare a second input voltage to the voltage from the voltage slope generator; and
a fifth register configured to store a fifth count based upon the second input voltage being input into the second comparator,
wherein output circuit is configured to calculate a digital value for the first input voltage based upon the first, second, third, and fifth counts.

12. A method for converting analog voltages to a digital value using a single slope analog to digital converter (ADC), comprising:
generating voltage slope;
generating a first reference voltage, a second reference voltage, and a third reference voltage, where the first reference voltage equals the sum of the second reference voltage and the third reference voltage;
comparing the first reference voltage to a voltage output from the generated voltage slope and storing a first count based upon the first reference voltage;
comparing the second reference voltage to the voltage output from the generated voltage slope and storing a second count based upon the second reference voltage;
comparing the third reference voltage to the voltage output from the generated voltage slope and storing a third count based upon the third reference voltage;
comparing a first input voltage to the voltage output from the generated voltage slope and storing a fourth count based upon the first input voltage; and
calculating a digital value for the first input voltage based upon the first, second, third, and fourth counts.

13. The method of claim 12, wherein the second voltage reference is based upon a first resistor and the first reference voltage and the third voltage reference is based upon a second resistor and the first reference voltage.

14. The method of claim 13, wherein the second voltage reference Vref2 is:

$$Vref2 = Vref1 * R1/(R1+R2); \text{ and}$$

the third reference voltage Vref3 is:

$$Vref3 = Vref1 * R2/(R1+R2),$$

where Vref1 is the first voltage reference, R1 is the resistance of the first resistor, and R2 is the resistance of the second resistor.

15. The method of claim 13, wherein generating the first reference voltage, the second reference voltage, and the third reference voltage includes controlling three switches that are used to produce the first, second, and third reference voltages.

16. The method of claim 12, wherein the digital value for the first input voltage is calculated as:

$$V_X = Vref \frac{Reg1 + Reg2 - Reg3 - Reg4}{2 \cdot Reg1 - Reg3 - Reg4},$$

where Vref is the first voltage reference, Reg1 is the first stored count, Reg2 is the second stored count, Reg3 is the third stored count, and Reg4 is the fourth stored count.

17. The method of claim 12, wherein the values of first, second, and third counts are sequentially stored during a first generated voltage slope, and the value of the fourth count is stored during a second generated voltage slope.

18. The method of claim 12, further comprising converting a digital value to an analog voltage further comprising:
buffering the generated voltage slope;
comparing a digital input value to a clock value; and
sampling and holding the buffered generated slope circuit when the clock value is equal to the digital input value.

19. The method of claim 18, further comprising:
receiving inputs of a digital value, the fourth count Reg4 from the fourth register, and a calculated value of the delay td of the first comparator; and
producing an adjusted digital value that is compared to the clock value.

20. The method of claim 19, further comprising producing a first output value Vadc1 on a first generated slope and producing a second output value Vadc2 using the Reg4 and td values from the associated with the first output value Vadc1.

21. The method of claim 12, further comprising:
comparing a second input voltage to the voltage output from the generated voltage slope and storing a fifth count based upon the second input voltage; and
calculating a digital value for the second input voltage based upon the first, second, third, and fifth counts.

* * * * *